United States Patent
Shibata et al.

[11] Patent Number: 6,150,651
[45] Date of Patent: Nov. 21, 2000

[54] PHOTOINTERRUPTER DRIVING CIRCUIT CAPABLE OF DECREASING THE NUMBER OF PARTS

[75] Inventors: Akira Shibata, Murayama; Yoshihito Otomo; Koichi Seno, both of Yamagata, all of Japan

[73] Assignee: Mitsumi Electric Co., Ltd., Tokyo, Japan

[21] Appl. No.: 09/234,160

[22] Filed: Jan. 21, 1999

[30] Foreign Application Priority Data

Jan. 27, 1998 [JP] Japan .................................. 10-014236

[51] Int. Cl.[7] ........................................ H01J 40/121
[52] U.S. Cl. ...................... 250/214 R; 318/453; 347/7; 396/277; 396/397; 250/229
[58] Field of Search ........................ 250/214 R, 559.27, 250/559.28, 559.29, 226, 223 R, 229; 318/453; 347/7, 86; 396/277, 397

[56] References Cited

U.S. PATENT DOCUMENTS

| | | | |
|---|---|---|---|
| 4,882,511 | 11/1989 | von de Heide | 310/67 R |
| 4,972,078 | 11/1990 | Hasebe et al. | 250/229 |
| 4,996,549 | 2/1991 | Yamaguchi | 396/397 |
| 5,952,800 | 9/1999 | Shibata et al. | 318/453 |
| 5,953,547 | 9/1999 | Imai et al. | 396/277 |

FOREIGN PATENT DOCUMENTS

| | | |
|---|---|---|
| 9-91859 | 4/1997 | Japan . |
| 9-97493 | 4/1997 | Japan . |
| 9-97839 | 4/1997 | Japan . |

*Primary Examiner*—Loha Ben
*Attorney, Agent, or Firm*—Frishauf, Holtz, Goodman, Langer & Chick, P.C.

[57] ABSTRACT

In a photointerrupter comprising a light emitting diode and a photo transistor which are opposed to each other, the photo transistor has an emitter which is grounded through a resistor while the light emitting diode has a cathode which is connected to an input terminal of a one IC chip for controlling a flexible disk drive. The one IC chip incorporates a constant current source which is connected to the input terminal through an npn-type bipolar transistor. The one IC chip incorporates a logic circuit having an output terminal which is connected to a base of the npn-type bipolar transistor.

3 Claims, 8 Drawing Sheets

PHOTOINTERRUPTER DRIVING CIRCUIT CAPABLE OF DECREASING THE NUMBER OF PARTS

BACKGROUND OF THE INVENTION

This invention relates to a photointerrupter driving circuit for use in a flexible or floppy disk drive (which may be abbreviated to "FDD") and, more specifically, a photointerrupter driving circuit for driving a photointerrupter for use in detecting a position of the most end track in a magnetic recording medium of a flexible or floppy disk (which may be abbreviated to "FD") loaded therein.

As is well known in the art, the flexible disk drive of the type is a device for carrying out data recording and reproducing operation to and from the magnetic recording medium of the flexible disk loaded therein. In addition, such a flexible disk drive is loaded in a portable electronic equipment such as a laptop personal computer, a notebook-size personal computer, a notebook-size word processor, or the like.

The flexible disk drive of the type comprises a magnetic head for reading/writing data from/to the magnetic recording medium of the flexible disk, a carriage assembly for supporting the magnetic head at a tip thereof with the magnetic head movably along a predetermined radial direction to the flexible disk, a stepping motor for moving the carriage assembly along the predetermined radial direction, and a spindle motor for rotatably driving the magnetic recording medium with the flexible disk held.

In order to control such a flexible disk drive, an FDD control apparatus is already proposed. By way of example, Japanese Unexamined Patent Publication Tokkai No. Hei 9-97,493 (97,493/1997) discloses, as the FDD control apparatus, one integrated circuit (IC) chip which incorporates first through third control circuits therein. The first control circuit is a reading/writing (hereinafter called "R/W") control circuit for controlling reading/writing of data. The second control circuit is a stepping motor (hereinafter called "STP") control circuit for controlling drive of the stepping motor. The third control circuit is a general controlling (hereinafter called "CTL") control circuit for controlling whole operation of the flexible disk drive. This IC chip is generally implemented by a metal oxide semiconductor (MOS) IC chip where a number of MOS field effect transistors (FETs) are integrated therein.

The FDD control apparatus comprises not only the one IC chip but also a spindle motor IC chip for controlling drive of the spindle motor. The spindle motor IC chip is implemented by a bipolar IC chip where a number of bipolar transistors are integrated therein.

Now, flexible disk drives have different specifications due to customers or users. The specification defines, for example, drive select 0 or 1, the presence or absence of a special seek function, the presence or absence of an automatic chucking function, a difference of logic for a density out signal, a difference of logic for a mode select signal, 1M mode 250 kbps or 300 kbps, and so on. If development is made of one IC chips which individually satisfy the different specification, a number types of one IC chips must be prepared. In order to avoid this, a one IC chip having a selectable function circuit is already proposed, for example, in Japanese Unexamined Patent Publication Tokkai No. Hei 9-97,839 (97,839/1997) wherein all functions satisfying all specifications are preliminarily incorporated therein and one of the functions is selected in accordance with a particular specification.

As is well known in the art, the flexible disk driven by the flexible disk drive includes a disk-shaped magnetic recording medium accessed by the magnetic head. The magnetic recording medium has a plurality of tracks on a surface thereof that serve as paths for recording data and that are formed in a concentric circle along a radial direction. The flexible disk has eighty tracks on side which include the most outer circumference track (which is named "TR00") and the most inner circumference track (which is named "TR79"). The most outer circumference track TR00 is herein called the most end track.

It is necessary to position the magnetic head at a desired track position in a case where the flexible disk is accessed by the magnetic head in the flexible disk drive. For this purpose, the carriage assembly for supporting the magnetic head at the tip thereof must be positioned. Inasmuch as the stepping motor is used as a driving arrangement for driving the carriage assembly, it is possible to easily carry out the positioning of the carriage assembly. In spite of this, it is necessary for the flexile disk drive to detect only the position of the most end track TR00 in the magnetic recording medium of the flexible disk loaded therein. In order to detect the position of the most end track TR00, the carriage assembly is provided with an interception plate which projects from a base section thereof downwards and a photointerrupter is mounted on a substrate in the vicinity of a main frame opposed to the carriage assembly. For example, see Japanese Unexamined Patent Publication Tokkai No. Hei 9-91,859 (91,859/1997). That is, it is possible to detect that the magnetic head is laid in the position of the most end track TR00 in the magnetic recoding medium of the flexible disk because the interception plate intercepts an optical path in the photointerrupter. Such a track position detecting mechanism is called a 00 sensor in the art.

Now, the description will proceed to a conventional photointerrupter driving circuit for driving the photointerrupter used as the 00 sensor.

The photointerrupter comprises a light emitting diode (LED) and a photo transistor which are opposed to each other. The light emitting diode has an anode connected to a power supply terminal while photo transistor has a collector connected to the power supply terminal.

The conventional photointerrupter driving circuit comprises a first resistor having an end connected to an emitter of the photo transistor, a second resistor having an end connected to a cathode of the light emitting diode, and an npn-type bipolar transistor having a collector connected to other ends of the first and the second resistors and an emitter which is grounded.

In the photointerrupter driving circuit with such structure, by turning the npn-type bipolar transistor on/off, turning a power supply for the photointerrupter on/off is carried out. In addition, by using the second resistor, setting of a value of a current flowing in the light emitting diode is carried out.

As described above, in the conventional photointerrupter driving circuit, the second resistor is required for setting the value of the current flowing in the light emitting diode. As a result, the conventional photointerrupter driving circuit is disadvantageous in that the number of parts increases, cost is high, and man-hour increases. In addition, there is the possibility of causing malfunction of mounting due to defective solder on mounting the second resistor on a substrate.

SUMMARY OF THE INVENTION

It is therefore an object of the present invention to provide a photointerrupter driving circuit which is capable of decreasing the number of parts.

It is another object of the present invention to provide a photointerrupter driving circuit which is low-cost.

It is still another object of the present invention to provide a photointerrupter driving circuit which is capable of decrease malfunction of mounting.

Other objects of this invention will become clear as the description proceeds.

The present inventors repeatedly studied how to drive a photointerrupter without the second resistor. On the other hands, to control the flexible disk drive, an FDD control integrated circuit (one IC chip) is already mounted on a substrate. Accordingly, the present inventors reached the idea that a problem in the above-mentioned conventional photointerrupter driving circuit is solved by using a constant current source in the FDD control IC in place of the second resistor.

On describing the gist of this invention, it is possible to be understood that a photointerrupter driving circuit is for use in a flexible disk drive for driving a flexible disk having a magnetic recording medium loaded therein. The photointerrupter driving circuit is being for driving a photointerrupter for use in detecting a position of the most end track of the magnetic recording medium of the flexible disk. The photointerrupter comprises a light emitting diode and a photo transistor which are opposed to each other. The light emitting diode has an anode connected to a power supply terminal while the photo transistor has a collector connected to the power supply terminal. According to an aspect of this invention, the above-understood photointerrupter driving circuit comprises a resistor between an emitter of the photo transistor and a grounding terminal, and an integrated circuit having an input terminal connected to a cathode of said light emitting diode. The integrated circuit is for controlling the flexible disk drive. The integrated circuit incorporates a constant current source which is connected to the input terminal through switching means.

Inasmuch as the constant current source incorporated in the integrated circuit is used, it is possible to eliminate a resistor for setting a value of a current flowing in the light emitting diode. Therefore, it is possible to decrease the number of parts and to decrease malfunction of mounting.

DESCRIPTION OF THE PREFERRED EMBODIMENT

Figure 1:
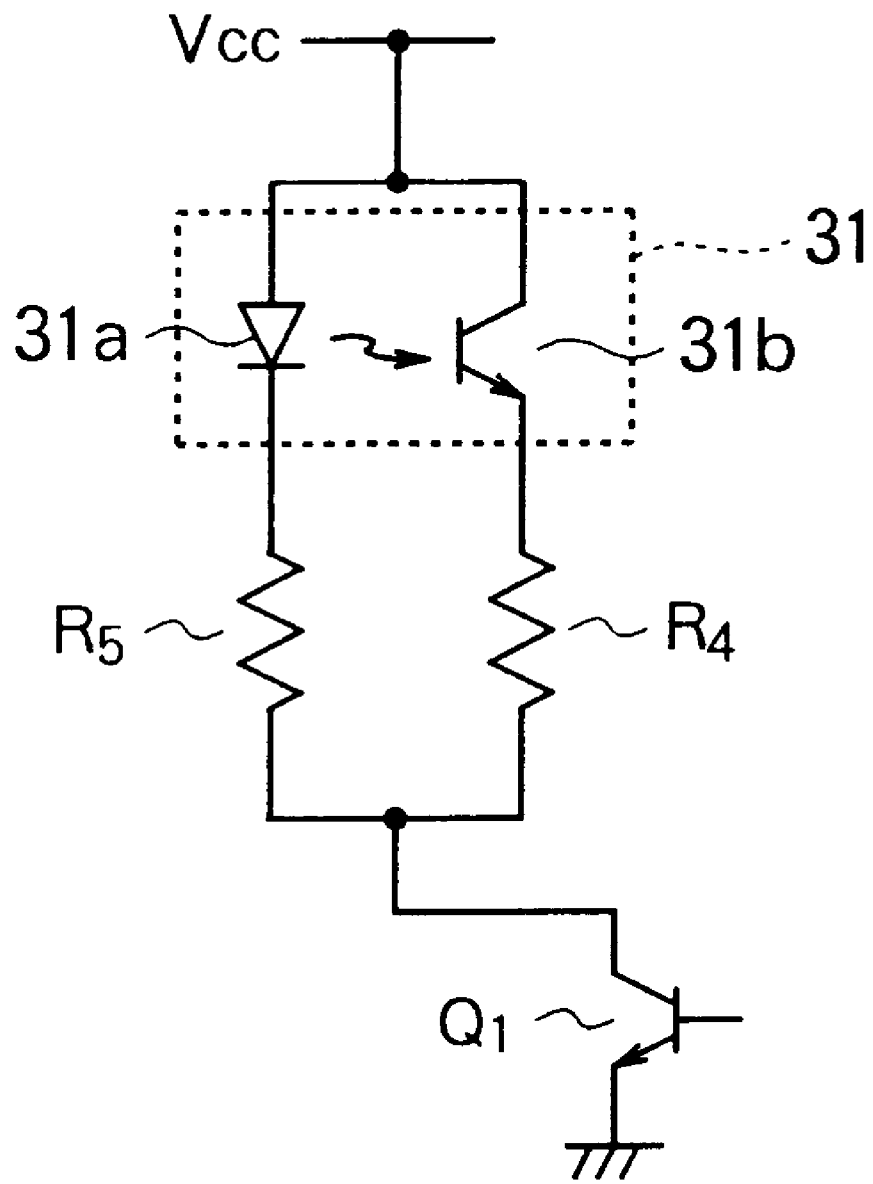
FIG. 1 is a circuit diagram of a conventional photointerrupter driving circuit.

Referring to FIG. 1, a conventional photointerrupter driving circuit will be described at first in order to facilitate an understanding of the present invention. The illustrated photointerrupter driving circuit is for driving a photointerrupter 31 used as a 00 sensor.

The photointerrupter 31 comprises a light emitting diode (LED) 31$a$ and a photo transistor 31$b$ which are opposed to each other. The light emitting diode 31$a$ has an anode connected to a power supply terminal Vcc while the photo transistor 31$b$ has a collector connected to the power supply terminal.

The conventional photointerrupter driving circuit comprises a first resistor $R_4$ having an end connected to an emitter of the photo transistor 31$b$, a second resistor $R_5$ having an end connected to a cathode of the light emitting diode 31$a$, and an npn-type bipolar transistor $Q_1$. The npn-type bipolar transistor $Q_1$ has a collector connected to other ends of the first and the second resistors $R_4$ and $R_5$ and an emitter which is grounded.

In the photointerrupter driving circuit with such structure, by turning the npn-type bipolar transistor $Q_1$ on/off, turning a power supply for the photointerrupter 31 on/off is carried out. In addition, by using the second resistor $R_5$, setting of a value of a current flowing in the light emitting diode 31$a$ is carried out.

As described above, in the conventional photointerrupter driving circuit, the second resistor $R_5$ is required for setting the value of the current flowing in the light emitting diode 31$a$. As a result, the conventional photointerrupter driving circuit is disadvantageous in that the number of parts increases, cost is high, and man-hour increases, as mentioned in the preamble of the instant specification. In addition, there is the possibility of causing malfunction of mounting due to defective solder on mounting the second resistor $R_5$ on a substrate, as also mentioned in the preamble of the instant specification.

Figure 2:
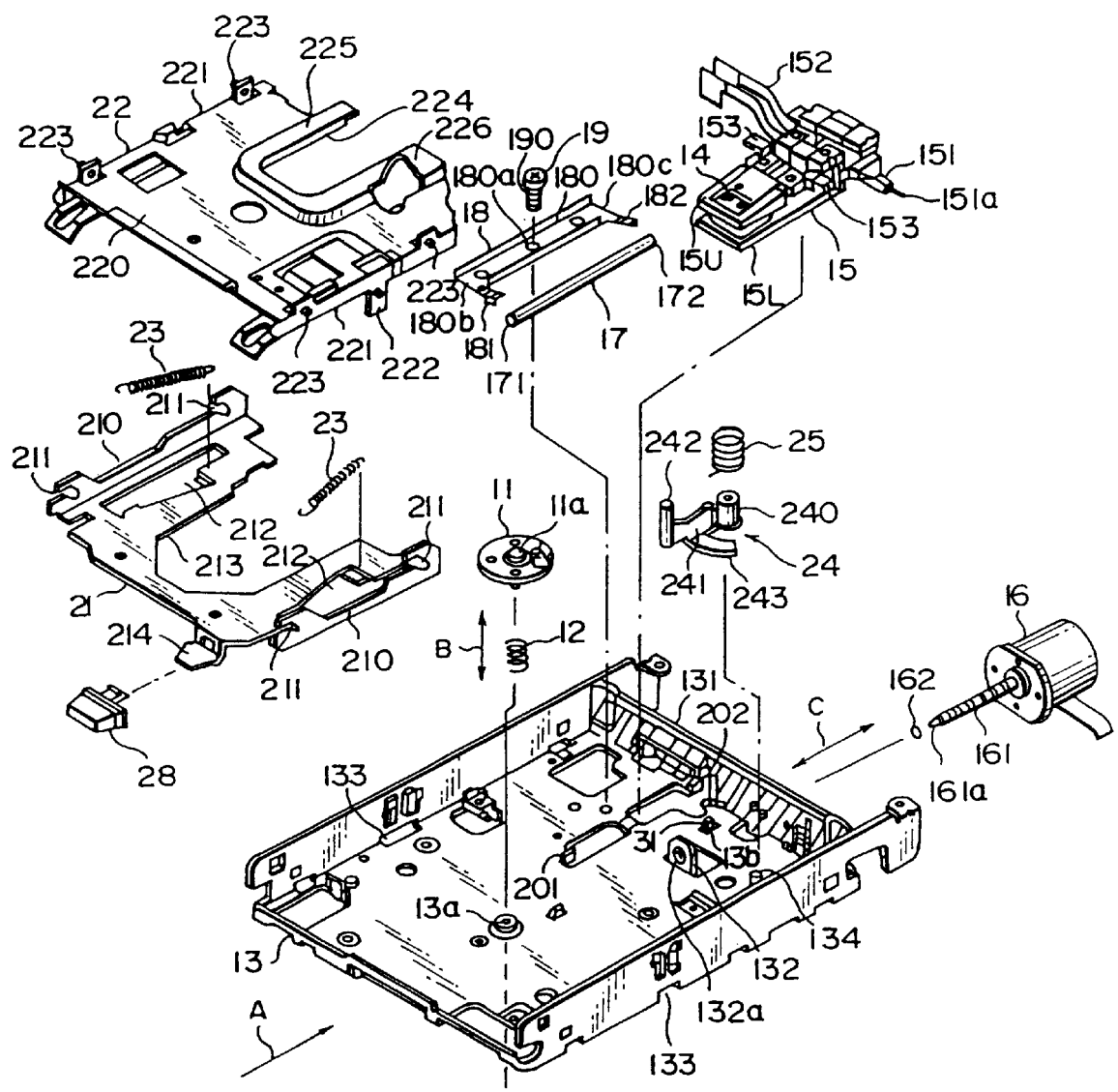
FIG. 2 is an exploded perspective view showing a main part of a flexible disk drive to which a magnetic sensor according to this invention is applicable.
Figure 3:
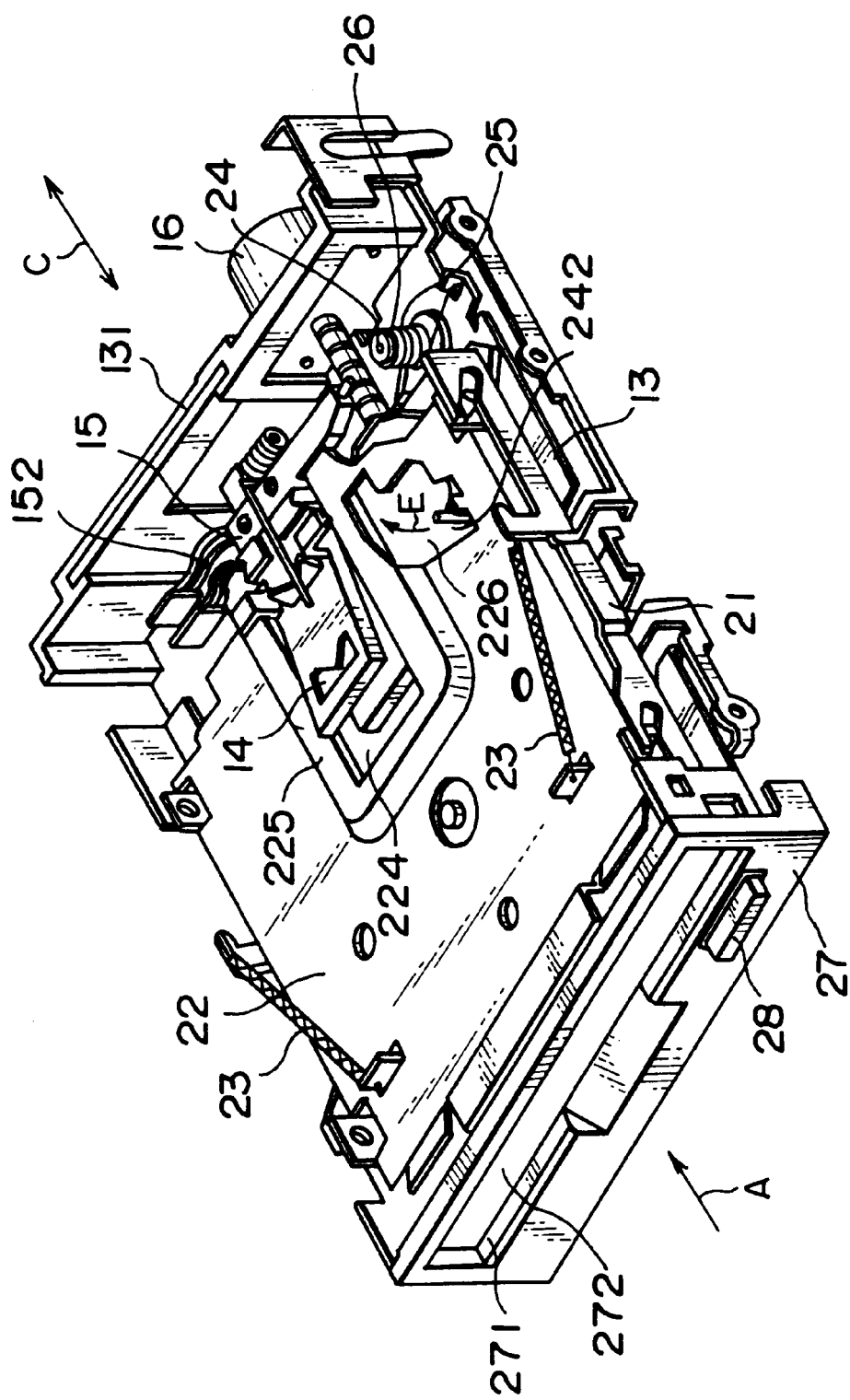
FIG. 3 is a schematic perspective view of the flexible disk drive illustrated in FIG. 2 as viewed from front obliquely.

Referring to FIGS. 2 and 3, the description will proceed to a flexible disk drive of a 3.5-inch type which is enable to be loaded in a portable electronic equipment and to which a magnetic sensor according to this invention is applicable. FIG. 2 is an exploded perspective view of the flexible disk drive and FIG. 3 is a perspective view of the flexible disk drive viewing from a front side.

The illustrated flexible disk drive is a device for driving a flexible disk of a 3.5-inch type (which will later be described). The flexible disk is loaded in the flexible disk drive from a direction indicated by an arrow A in FIGS. 2 and 3. The loaded flexible disk is held on a disk table 11 having a rotation axis 11$a$. In this event, the rotation axis 11$a$ coincides with a center axis of the flexible disk. The rotation axis 11$a$ of the disk table 11 is inserted in a baring 13$a$ formed on a main frame 13 via a spring 12 and therefore the disk table 11 is rotatably supported on a main surface of the main frame 13. Accordingly, the rotation axis 11$a$ of the disk table 11 has an axial direction B which extends in parallel with a thick direction of the main frame 13. The disk table 11 is rotatably driven by a spindle motor (not shown), which is mounted on a back surface of the main frame 13, thereby a magnetic recording medium of the flexible disk rotates. In addition, on the back surface of the main frame is attached a main printed substrate (which will later become clear) on which a number of electronic parts (not shown) are mounted.

The flexible disk drive comprises a pair of upper and lower magnetic heads 14 (only the upper magnetic head magnetic recording medium of the flexible disk. The magnetic heads 14 are supported in a carriage assembly 15 at a tip thereof that is laid in the flexible disk drive at a rear side. That is, the carriage assembly 15 comprises an upper carriage 15U for supporting the upper magnetic head 14 and a lower carriage 15L for supporting the lower magnetic head. The carriage assembly 15 is disposed over the main surface of the main frame 13 and is apart from the main frame 13 in the manner which will later be described. The carriage assembly 15 supports the magnetic heads 14 movably along a predetermined radial direction (i.e., a direction indicated by an arrow C in FIGS. 2 and 3) to the flexible disk.

In addition, the main frame 13 has at the rear side a side wall 131 on which a stepping motor 16 is fixed. The stepping motor 16 linearly drives the carriage assembly 15 along the predetermined radial direction C. More specifically, the stepping motor 16 has an axis of rotation (a driving shaft) 161 which extends in parallel with the predetermined radial direction C and which is threaded to form a male screw. The driving shaft 161 has a tip 161a which penetrates a hole 132a bored in a bent piece 132 and which is provided with a steel ball 162. The bent piece 132 is raised from the main surface of the main frame 13 by cutting and bending. By the hole 132a and the steel ball 162, a position of the driving shaft 161 is defined so as to extend in parallel with the predetermined radial direction C and the tip 161a is rotatably held.

On the other hand, the carriage assembly 15 comprises an arm 151 which extends from the lower carriage 15L to the driving shaft 161. The arm 151 has a leading edge 151a which is bent so as engage with the root in the male screw of the driving shaft 161. Therefore, when the driving shaft 161 of the stepping motor 16 rotates, the leading edge 151a of the arm 151 moves along the root in the male screw of the driving shaft 161, thereby moving the carriage assembly 15 along the predetermined radial direction C. At any rate, the stepping motor 16 serves as a driving arrangement for moving the carriage assembly 15 along the predetermined radial direction C.

Inasmuch as the driving shaft 161 of the stepping motor 16 is disposed at one side of the carriage assembly 15, the one side of the carriage assembly 15 is movably supported by the driving shaft 161 and is apart from the main surface of the main frame 13. However, because support occurs by the driving shaft 161, it is difficult to dispose the whole of the carriage assembly 15 apart from the main surface of the frame 13. For this purpose, it is necessary to support and guide the carriage assembly 15 at another side thereof. To guide the carriage assembly 15 is a guide bar 17. That is, the guide bar 17 is opposed to the driving shaft 161 of the stepping motor 16 with the carriage assembly 15 inserted between the guide bar 17 and the driving shaft 161. The guide bar 17 extends in parallel with the predetermined radial direction C and has one end 171 and another end 172 which are mounted on the main surface of the main frame 13 in the manner which later be described. The guide bar 17 guides the carriage assembly 15 along the predetermined radial direction C. As a result, the whole of the carriage assembly 15 is disposed from the main surface of the main frame 13.

In addition, a flexible printed circuit (FPC) 152 extends from the carriage assembly 15 to the vicinity of the guide bar 17 and the flexible printed circuit 152 are electrically connected to the main printed substrate attached to the back surface of the main frame 13.

The guide bar 17 is clamped on the main surface of the main frame 13 by a guide bar clamp 18. The guide bar clamp 18 is fixed on the main surface of the main frame 13 at a center portion thereof by a binding small screw 19. More specifically, the guide bar clamp 18 comprises a rectangular fixed member 180 having a length longer than that of the guide bar 17 by a short distance. In about the center of the rectangular fixed member 180, a hole 180a is drilled through which a screw shaft 190 of the binding small screw 19 passes. The rectangular fixed member 180 has one end 180b and another end 180c from which a pair of arms 181 and 182 extend to clamp the one end 171 and the other end 172 of the guide bar 17 which the guide bar 17 sandwiched between the arms 181 and 182, respectively.

Inasmuch as the guide bar clamp 18 merely clamps the guide bar 17, the guide bar 17 is not mounted on the main surface of the main frame 13 by the guide bar clamp 18 alone. For this purpose, a pair of locating members for locating the both ends 171 and 172 of the guide bar 17 is needed. As the pair of locating members, a pair of bent pieces 201 and 202 is used which are formed by cutting and bending parts of the main frame 13. At any rate, the pair of bent pieces 201 and 202 locates both ends 171 and 172 of the guide bar 17 to mount the guide bar 17 on the main surface of the main frame 13 in cooperation with the guide bar clamp 18.

The lower carriage 15L of the carriage assembly 15 serves as a supporting frame for supporting the carriage assembly 15 slidably along the guide bar 17. The lower carriage 15L has a projecting portion (not shown) which projects into the main surface of the main frame 13 at a side of the guide bar 17. The guide bar 17 is slidably fitted in the projection portion.

The flexible disk drive further comprises an eject plate 21 and a disk holder 22. Each of the main frame 13, the eject plate 21, and the disk holder 22 is formed to perform bending, press working, and bending of a metal plate.

The eject plate 21 is mounted on the main surface of the main frame 13 slidably along the insertion direction A of the flexible disk and an opposite direction. In the manner which will later become clear, the eject plate 21 holds, in cooperation with the disk holder 22, the flexible disk on operating of the flexible disk drive. In addition, the eject plate 21 holds the flexible disk slidably along in the insertion direction A so as to allow the flexible disk drive to load the flexible disk therein along the insertion direction A and to allow the flexible disk drive to eject the flexible disk therefrom along the opposite direction. The eject plate 21 comprises a pair of side walls 210 which are opposed to each other. Each of the side walls 210 has a pair of cam portions 211. In addition, the eject plate 21 has a bottom surface on which cut portions 212 are formed along the both side walls 210 and a U-shaped cut portion 213 is formed at a center portion thereof so as to enclose the disk table 11. Furthermore, the eject plate 21 has a back surface on which a pin (not shown) is formed. The pin engages with a stop part of an eject lever which will later be described.

The disk holder 22 is disposed on the eject plate 21. The disk holder 22 comprises a principal surface 220 and a pair of side walls 221 which is formed at both side ends of the principal surface 220 and which is opposed to each other. The both side walls 221 have projection pieces 222 (only one is illustrated). The projection pieces 222 are inserted in bores 133 of the main frame 13 through the cut portions 212 of the eject plate 21. Inasmuch as the projection pieces 222 are inserted in the bores 133 of the main frame 13, the disk holder 22 is positioned against the main frame 13 in the insertion direction A and the disk holder 22 is reciprocated in the axial direction B of the rotation axis 11a of the disk table 11. Each of the both side walls 221 has a pair of pins 223. The pins 223 are inserted in the cam portions 211 formed in the side walls 210 of the eject plate 21. Between the disk holder 22 and the eject plate 21, eject springs 23 bridge.

Although the disk holder 22 is provided with the projection pieces 222 and the bores 133 are formed in the main frame 13 in the above-mentioned embodiment, restriction is not made to this and the main frame 13 may be provided with projection pieces and bores may be formed in the disk holder 22.

In addition, the disk holder 22 has a rectangular opening section 224 at a center portion in a back side in the insertion direction A. The rectangular opening section 224 is laid in a corresponding position of the upper carriage 15U of the carriage assembly 15 and extends in the predetermined radial direction C. So as to enclose the opening section 224, a U-shaped swelled portion 225 is formed where the principal surface 220 of the disk holder swells at periphery upwards. On the other hand, the carriage assembly 15 comprises a pair of side arms 153 which extends in a lateral direction perpendicular to a longitudinal direction of the carriage assembly 15. The side arms 153 are located on or over the swelled portion 225. As will later be described, in a state where the flexible disk is ejected from the disk holder 22, the side arms 153 engages with the swelled portion 225, thereby the pair of upper and lower magnetic heads 14 are apart from each other. In addition, the disk holder 22 has an additional opening section 226 at a right-hand side of the opening section 224 in the back side of the insertion direction A. The opening section 226 has a shape so as to allow a lever part of the eject lever (which will later be described) rotatably move.

In the vicinity of the carriage assembly 15 on the main frame 13, the eject lever depicted at 24 is formed to rotatably move. More specifically, on the main frame 13, a rod pin 134 stands up which extends from the main surface thereof upwards. The eject lever 24 comprises a cylindrical part 240 in which the rod pin 134 is inserted, an arm part (the lever part) 241 extending from the cylindrical part 240 in a radial direction, a projection part 242 which is formed in the arm part 241 at a free end thereof and which extends upwards, and an arc-shaped stop part 243 which extends from a side of the free end of the arm part 241 in a circumferential direction. In the eject lever 24, an eject lever spring 25 is attached around the cylindrical part 240 and the eject lever spring 25 urges the eject lever 24 in a counterclockwise direction on a paper of FIG. 2. The projection part 242 of the eject lever 24 is freely fitted in the opening section 226 of the disk holder 22. The projection part 242 is engaged with an upper end of a right-hand side edge of a shutter in the flexible disk, that will later be described, to control opening and shutting of the shutter. In addition, as shown in FIG. 3, a screw 26 is thrust into a tip of the rod pin 134, thereby preventing the eject lever 24 from falling off the rod pin 134.

In addition, the main frame 13 has a front end section on which a front panel 27 is attached. The front panel 27 has an opening 271 for taking the flexible disk in and out and a door 272 for opening and shutting the opening 271. Into the front panel 27, an eject button 28 projects movably backward and forward. The eject button 28 is fitted in a protrusion part 214 which protrudes from a front end of the eject plate 21 forwards.

Figure 4:
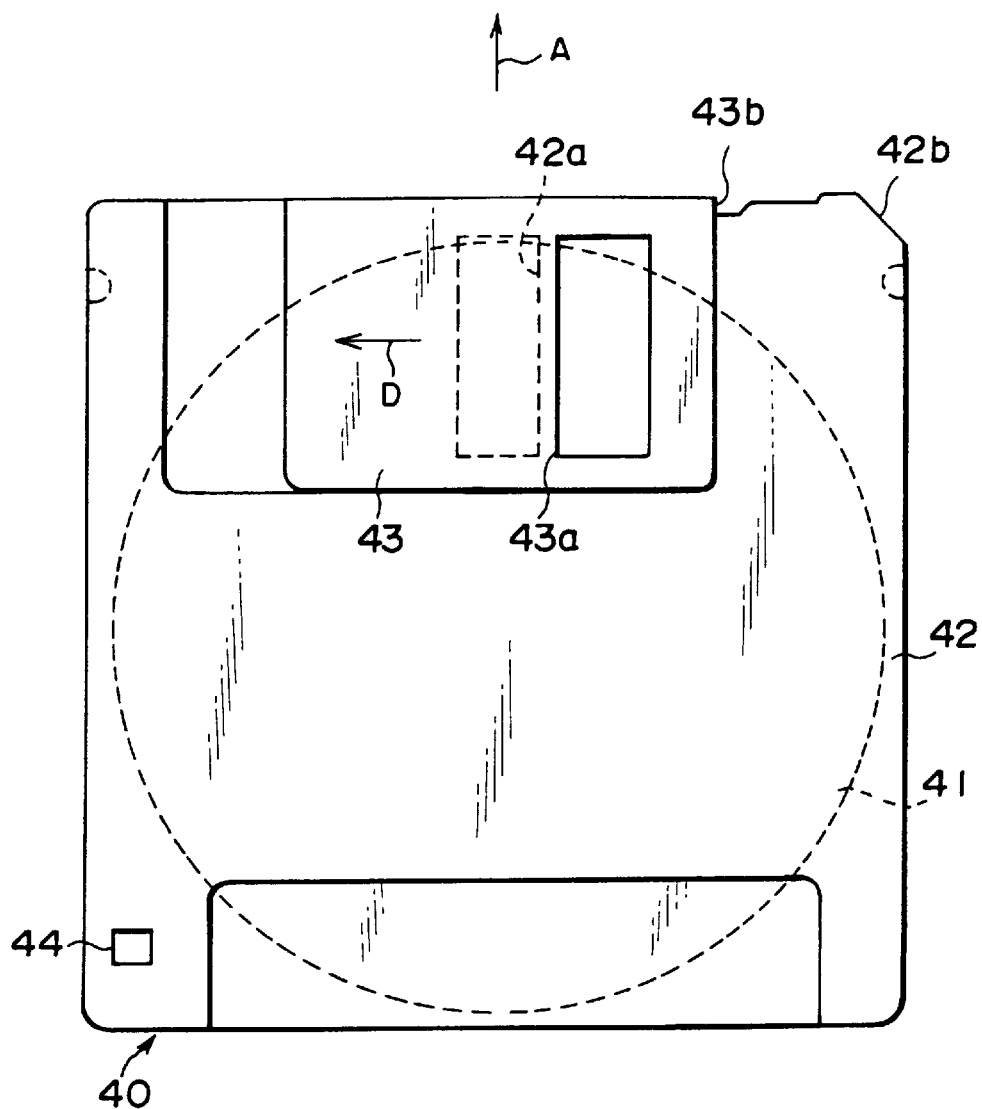
FIG. 4 is a plan view showing a flexible disk driven by the flexible disk drive.

Referring to FIG. 4, the description will proceed to the flexible disk (FD) driven by the flexible disk drive (FDD) illustrated in FIGS. 2 and 3. The illustrated flexible disk depicted at 40 comprises a disk-shaped magnetic recording medium 41, a shell 42 for covering or receiving the magnetic recording medium 41, and the shutter depicted at 43 slidably in a direction indicated by an arrow D in FIG. 4. The shutter 43 has a shutter window 43a. The shutter 43 is urged by a spring member (not shown) in a direction reverse to the direction D. The shell 42 has a head window 42a to enable an access of the magnetic recording medium 41 by the magnetic heads 14 (FIGS. 2 and 3) of the flexible disk drive.

In a state where the flexible disk 40 is not loaded in the flexible disk drive, the head window 43a is covered by the shutter 43 as shown in FIG. 4. When the flexible disk 40 is loaded in the flexible disk drive, the projection part 242 of the eject lever 42 (FIG. 2) engages with the upper end 43b of the right-hand side edge of the shutter 43 to slide the shutter 43 in the direction depicted at the arrow D.

The shell 42 has a chamfered portion 42b at a corner portion in upper and right-hand side. The chamfered portion 42b is for preventing reverse insertion (wrong insertion in a vertical direction or the insertion direction A). In addition, a write protection hole 44 is bored in the shell 42 at a corner portion in rear and left-hand side in the insertion direction A of FIG. 4.

As described above, in the flexible disk 40 driven by the flexible disk drive, the magnetic recording medium 41 accessed by the magnetic heads 14 (FIGS. 2 and 3) has a plurality of tracks on a surface thereof that serve as paths for recording data and that are formed in a concentric circle along a radial direction. The flexible disk 40 has eighty tracks on side which include the most outer circumference track (the most end track TR00 and the most inner circumference track TR79).

Figure 5:
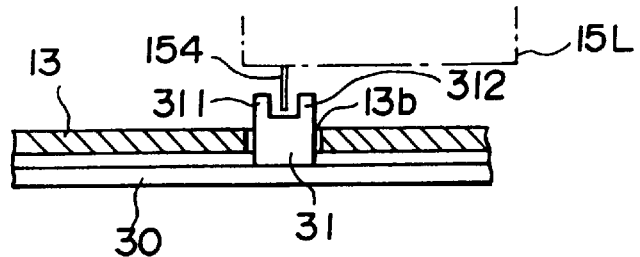
FIG. 5 is a sectional view for use in describing a set-up structure of a track position detecting mechanism (00 sensor) used in the flexible disk drive.

Referring to FIG. 5 in addition to FIG. 2, the description will proceed to a track position detecting mechanism (a 00 sensor) for detecting a position of the most end track TR00 of the magnetic recording medium 41.

In the carriage assembly 15, the lower carriage 15L is provided with an interception plate 154 which projects from a base section thereof downwards. On the other hand, the main printed substrate depicted at 30 is disposed on the back surface of the main frame 13 opposed to the carriage assembly 15. On the main printed substrate 30, a photointerrupter 31, which is used as the track position detecting mechanism (the 00 sensor), is mounted. For this purpose, the main frame 13 has a bore 13b in which the photointerrupter 31 is inserted.

As is well known in the art, the photointerrupter 31 comprises a first protrusion section 311 into which a light-emitting element (which will later be described) is built and a second protrusion section 312 into which a light-receiving element (which will later be described) is built. The first protrusion section 311 and the second protrusion section 312 are opposed to each other at two opposite wall surfaces which have two opening sections (not shown), as shown in FIG. 5. Through the two opening sections, an optical path is formed to go from the light-emitting element to the light-receiving element. In addition, the above-mentioned interception plate 154 passes through a path between the first protrusion section 311 and the second protrusion section 312.

In the 00 sensor with such a structure, it is possible to detect that the magnetic heads 14 (FIGS. 2 and 3) are laid in the position of the most end track TR00 in the magnetic recording medium 41 of the flexible disk 40 because the interception plate 154 intercepts the optical path in the phtointerrupter 31.

Figure 6:
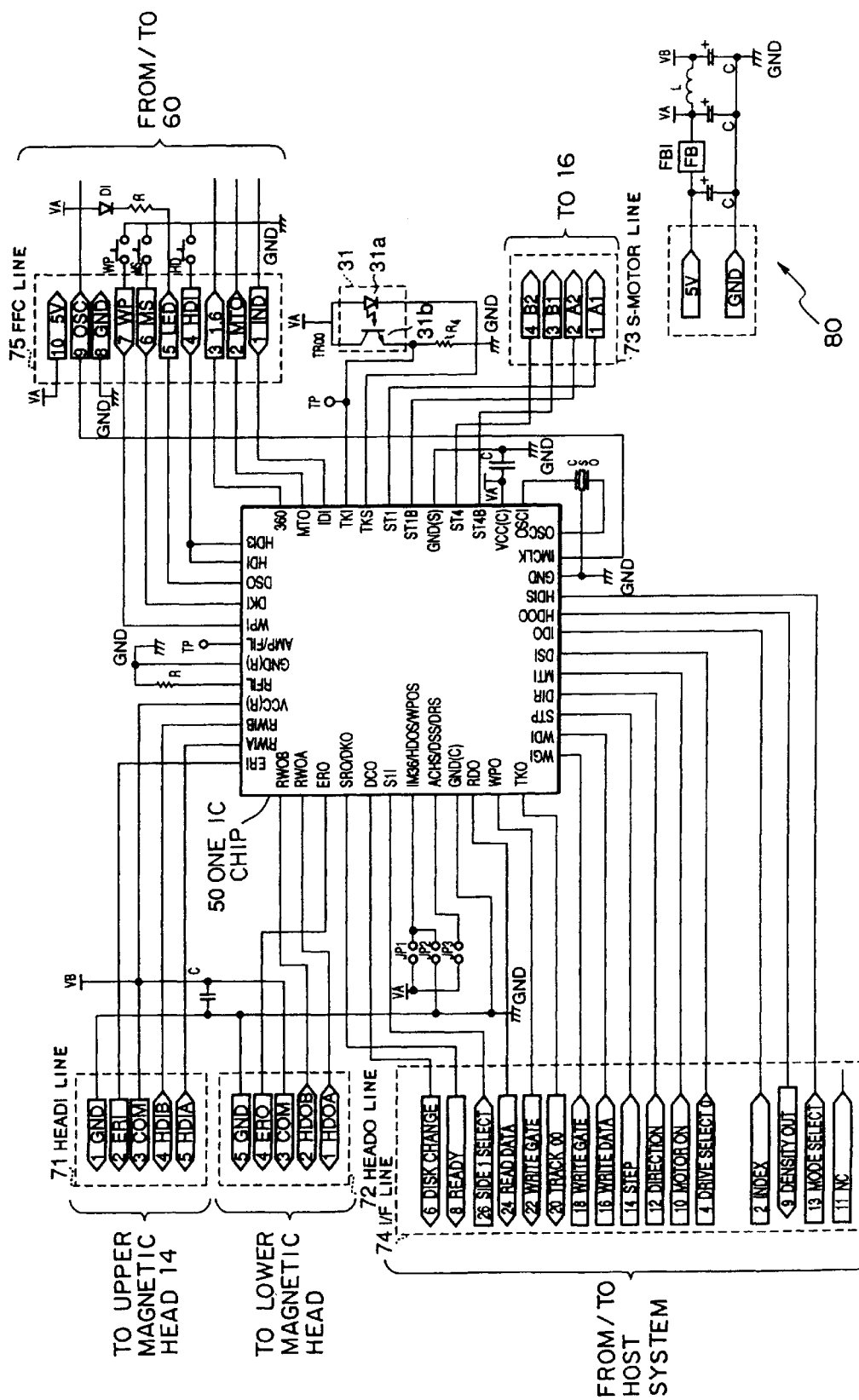
FIG. 6 is a plan view showing an external appearance of one IC chip of an FDD control apparatus to which this invention is applicable.
Figure 7:
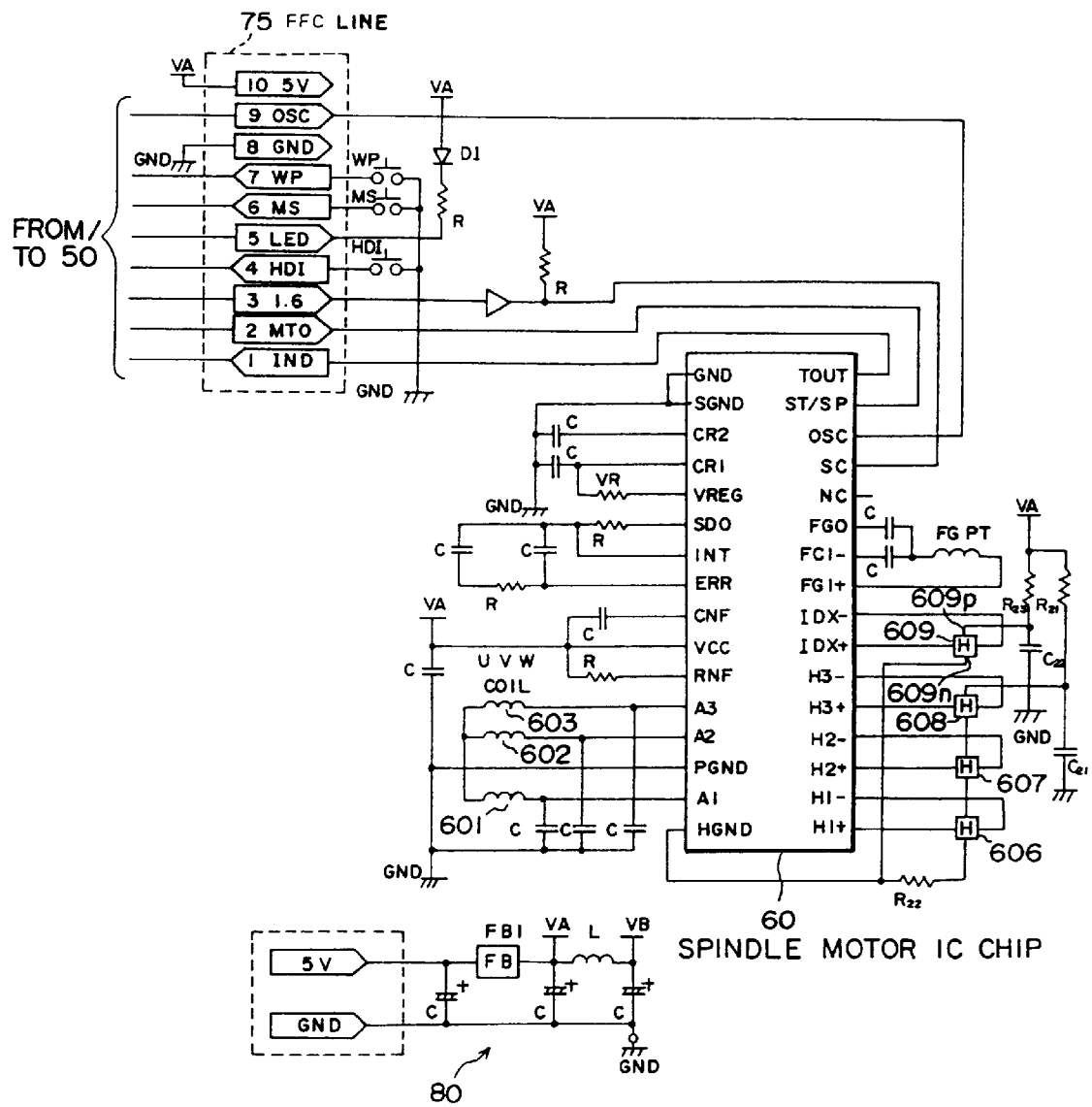
FIG. 7 is plan view showing an external appearance of a spindle motor IC chip of the FDD control apparatus that is used together with the one IC chip illustrated in FIG. 6.

Referring to FIGS. 6 and 7, the description will proceed to an FDD control apparatus for controlling the flexible disk drive illustrated in FIGS. 2 and 3.

The illustrated FDD control apparatus comprises one integrated circuit (IC) chip 50 (FIG. 6), a spindle motor IC chip 60 (FIG. 7), and a power supply circuit 80. The one IC chip 50, the spindle motor IC chip 60, and the power supply circuit 80 are mounted on the main printed substrate 30 (FIG. 5). The spindle motor IC chip 60 is an IC chip for controlling drive of the spindle motor and is implemented by a bipolar IC chip where a number of bipolar transistors are integrated therein. On the other hand, the one IC chip 50 is implemented by a metal oxide semiconductor (MOS) IC chip where a number of MOS field effect transistors (FETs) are integrated therein. The power supply circuit 80 is a circuit for supplying a voltage of 5 V when a power switch (not shown) is turned on. The power supply circuit 80 has a first power supply terminal VA and a second power supply terminal VB.

Figure 8:
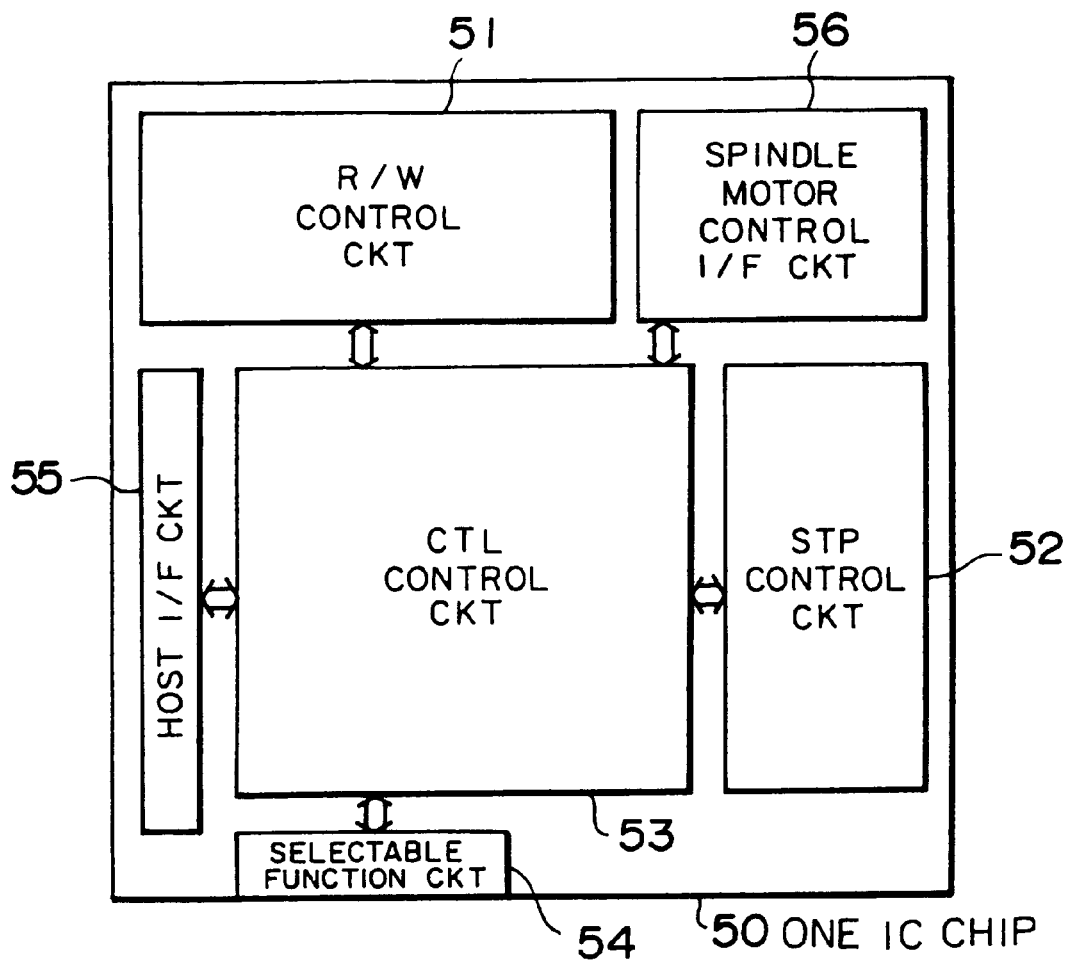
FIG. 8 is a block diagram showing a schematic structure of the one IC chip illustrated in FIG. 6.

Referring to FIG. 8 in addition to FIG. 6, the one IC chip 50 incorporates first through third control circuits 51, 52, and 53 therein. The first control circuit 51 is a R/W control circuit for controlling reading/writing of data. The second control circuit 52 is a STP control circuit for controlling drive of the stepping motor 16 (FIG. 2). The third control circuit 53 is a CTL control circuit for controlling whole operation of the flexible disk drive and may be called a logic circuit.

The one IC chip 50 further comprises the above-mentioned selectable function circuit depicted at 54, a host interface (I/F) circuit 55, and a spindle motor control I/F circuit 56. The CTL control circuit 53 is connected to R/W control circuit 51, the STP control circuit 52, the selectable function circuit 54, the host I/F circuit 55, and the spindle motor control I/F circuit 56.

The R/W control circuit 51 is connected to the upper magnetic head 14 (FIG. 2) and the lower magnetic head through a HEAD1 line 71 and a HEAD0 line 72, respectively. The STP control circuit 52 is connected to the stepping motor 16 (FIG. 2) through an S-MOTOR line 73. The host I/F circuit 55 is connected to a host system (not shown) through an I/F line 74. The spindle motor control I/F circuit 56 is connected to the spindle motor IC chip 60 (FIG. 7) through an FFC line 75.

Now, the description will proceed to input/output terminals of the one IC chip 50. The one IC chip 50 has R/W output terminals (ER1, RW1A, RW1B, ER0, RW0A, RW0B, VCC(R)) which are connected to the HEAD1 line 71 and the HEAD0 line 72. In addition, the one IC chip 50 has STP output terminals (ST1, ST1B, ST4, ST4B) which are connected to the S-MOTOR line 73. Furthermore, the one IC chip 50 has host input/output terminals (DC0, SII, RD0, WP0, TK0, WGI, WDI, STP, DIR, MTI, DSI, ID0, HDO0, HDIS) which are connected to the I/F line 74. The one IC chip 50 has spindle motor controlling input/output terminals (IDI, MTO, 360, HDI3, HDI, DSO, DKI, WPI, 1MCLK) which are connected to the FFC line 75. Other than these input/output terminals, the one IC chip 50 has two selectable function input terminals (1M36/HDOS/WPOS, ACHS/DSS/DRS), three input terminals for the 00 sensor (AMP/FIL, TKI, TKS), and so on.

The phtointerrupter 31 serving as the 00 sensor which comprises a light emitting diode (LED) 31a acting as the light-emitting element and a photo transistor 31b acting as the light-receiving element. The light emitting diode 31a has an anode connected to the first power supply terminal VA (Vcc) and a cathode connected to the TKS terminal of the one IC chip 50. The photo transistor 31b has a collector connected to the first power supply terminal VA (Vcc). In addition, the photo transistor 31b has an emitter which is grounded through a resistor $R_4$ and which is connected to the TKI terminal and the AMP/FIL terminal of the one IC chip 50.

Turning to FIG. 7, the spindle motor controlled by the spindle motor IC chip 60 is a brushless three-phase D.C. motor which has three coils (stator windings) 601, 602, and 603 of U-phase, V-phase, and W-phase although detailed structure thereof is not illustrated. In addition, the spindle motor comprises a permanent magnet type rotor (not shown) and a rotor position detector (which will later be described) for producing rotor position detected signals. On the other hand, the spindle motor IC chip 60 incorporates a driving transistor (a transistor rectifier) therein which consists of a plurality of bipolar transistors. That is, responsive to a rotor position of the motor, the spindle motor makes the bipolar transistors turn on and off to flow an electric current in the stator winding in question, thereby generates torque between magnetic poles of the rotor and the stator winding to rotate the rotor. With rotation of the rotor, the rotor position detected signals produced by the rotor position detector are changed to change the stator windings flowing the electric current, thereby continuing the rotation of the rotor.

In addition, the spindle motor comprises a frequency generation pattern FGPT for detecting the rotation speed of the rotor. The spindle motor IC chip 60 changes the stator windings to flow the electric current on the basis of the rotation speed of the rotor detected by the frequency generation pattern FGPT in accordance with the rotor position detected signals produced by the rotor position detector.

As shown in FIG. 7, three Hall devices 606, 607, and 608 are used as the above-mentioned rotor position detector. See, for example, U.S. Pat. No. 4,882,511 issued to Johann von der Heide as regards detailed relationship for arrangement of the Hall devices 606 to 608. In addition, another Hall device 609 is used for detection of an index.

Figure 9:
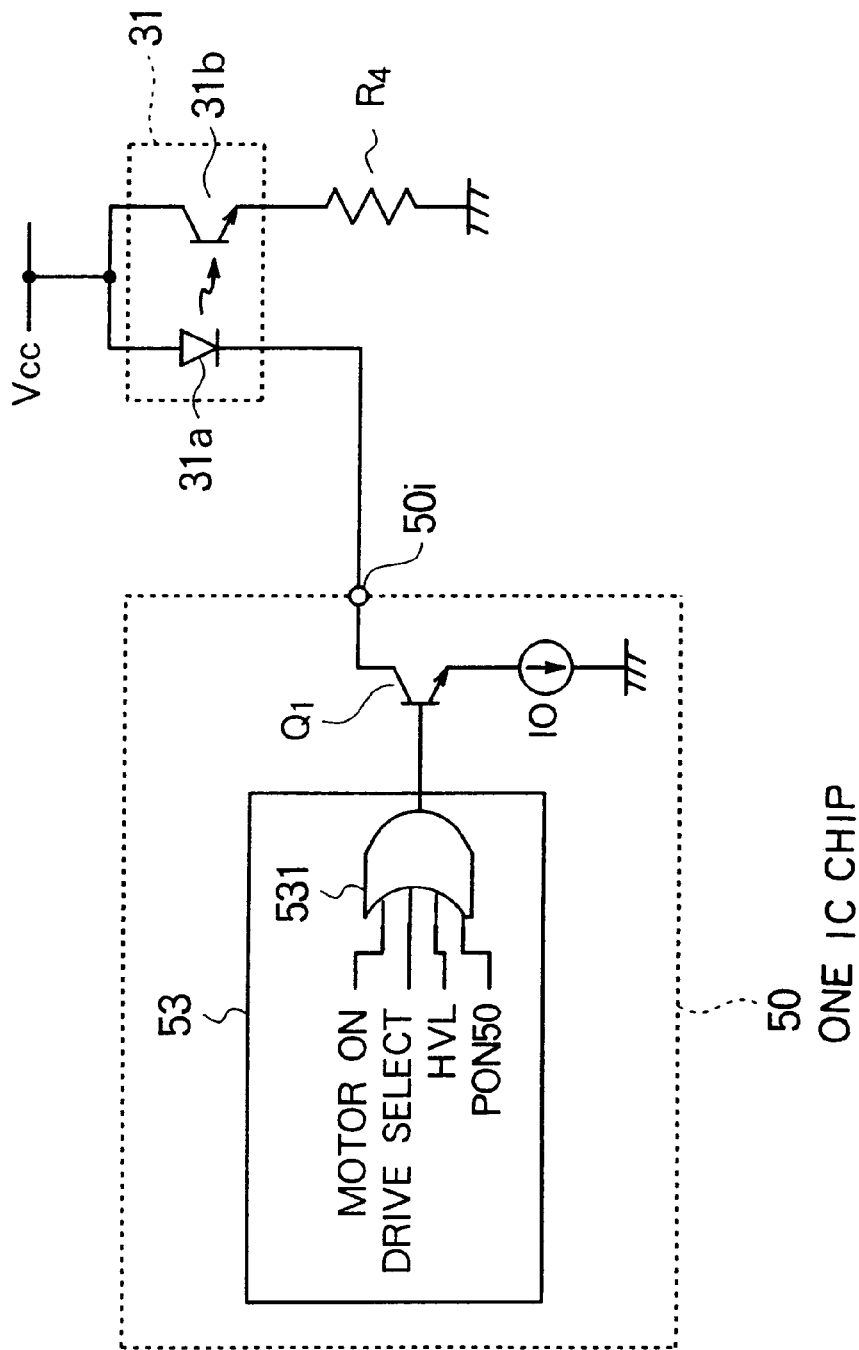
FIG. 9 is a circuit diagram of a photointerrupter driving circuit according to a preferred embodiment of this invention.

Referring to FIG. 9, the description will proceed to a photointerrupter driving circuit according to a preferred embodiment of this invention. The illustrated photointerrupter driving circuit comprises the resistor R4 between an emitter of the photo transistor 31b and a grounding terminal, and the one IC chip 50 having an input terminal 50i connected to a cathode of the light emitting diode 31a. The input terminal 50i is the TKS terminal in FIG. 6. The one IC chip 50 incorporates a constant current source IO which is connected to the input terminal 50i through an npn-type bipolar transistor $Q_1$. More specifically, the npn-type bipolar transistor $Q_1$ has a collector connected to the input terminal 50i and an emitter connected to the constant current source IO.

On the other hand, as described above, the one IC chip 50 incorporates the logic circuit 53 having an output terminal which is connected to a base of the npn-type bipolar transistor $Q_1$. More specifically, the logic circuit 53 includes an OR gate 531 for ORing a MOTOR ON signal, a DRIVE SELECT signal, an HVL signal indicative of a seek operation, and a PON50 signal. An output signal of the OR gate 531 is supplied to the base of the npn-type bipolar transistor $Q_1$. That is, when any of turning the DRIVE SELECT signal on, turning the MOTOR ON signal on, and the seek operation is satisfied, the npn-type bipolar transistor $Q_1$ is turned on to flow a constant current in the light emitting diode 31a by the constant current source IO.

As described above, in the above-mentioned embodiment, the constant current source IO formed in the one IC chip 50 is used as means for setting a value of a current of the light emitting diode 31a instead of the second resistor $R_5$ (FIG. 1). As a result, it is possible to decrease the number of parts and to decrease malfunction of mounting caused by defective solder or the like.

While this invention has thus far been described in conjunction with a preferred embodiment thereof, it is to be understood that modifications will be apparent to those skilled in the art without departing from the sprit of the invention. For example, although a bipolar transistor is used as a switching arrangement in the above-mentioned embodiment, of course other switching arrangement such as an MOSFET may be used.

What is claimed is:

1. A photointerrupter driving circuit for use in a flexible disk drive for driving a flexible disk having a magnetic recording medium loaded therein, wherein said photointerrupter driving circuit is for driving a photointerrupter for use in detecting a position of the most end track of the magnetic recording medium of said flexible disk, said photointerrupter comprising a light emitting diode and a photo transistor which are opposed to each other, the light emitting diode having an anode connected to a power supply terminal while the photo transistor has a collector connected to the power supply terminal, said photointerrupter driving circuit comprising:

a resistor coupled between an emitter of said photo transistor and a grounding terminal; and an integrated circuit having an input terminal connected to a cathode of said light emitting diode, said integrated circuit being for controlling said flexible disk drive, said integrated circuit incorporating a constant current source which is connected to the input terminal through switching device.

2. A photointerrupter driving circuit as claimed in claim 1, wherein said integrated circuit further incorporates a logic circuit having an output terminal which is connected to a control terminal of said switching device.

3. A photointerrupter driving circuit as claimed in claim 2, wherein said switching device comprises a npn-type bipolar transistor which has a base as the control terminal, a collector connected to the input terminal, and an emitter connected to said constant current source.

* * * * *